United States Patent
Schaadt et al.

(10) Patent No.: US 6,939,472 B2
(45) Date of Patent: Sep. 6, 2005

(54) ETCHING METHOD IN FABRICATIONS OF MICROSTRUCTURES

(75) Inventors: Gregory P. Schaadt, Santa Clara, CA (US); Hongqin Shi, San Jose, CA (US)

(73) Assignee: Reflectivity, Inc., Sunnyvale, CA (US)

(*) Notice: Subject to any disclaimer, the term of this patent is extended or adjusted under 35 U.S.C. 154(b) by 30 days.

(21) Appl. No.: 10/665,998

(22) Filed: Sep. 17, 2003

(65) Prior Publication Data

US 2005/0059253 A1 Mar. 17, 2005

(51) Int. Cl.[7] .................................................. C23F 1/00
(52) U.S. Cl. .............................. 216/2; 216/58; 216/59; 216/75; 216/76; 216/77; 216/79; 216/93; 438/5; 438/14; 438/706; 427/96
(58) Field of Search .............................. 216/2, 58, 59, 216/72, 75–77, 79, 93, 64; 438/5, 14, 706, 909; 427/96

(56) References Cited

U.S. PATENT DOCUMENTS

| | | | |
|---|---|---|---|
| 4,498,953 A | * | 2/1985 | Cook et al. .................. 438/738 |
| 4,551,197 A | | 11/1985 | Guilmette et al. |
| 5,726,480 A | | 3/1998 | Pister |
| 6,162,367 A | * | 12/2000 | Tai et al. ...................... 216/79 |
| 6,197,610 B1 | | 3/2001 | Toda |
| 6,355,181 B1 | | 3/2002 | McQuarrie |
| 6,409,866 B1 | | 6/2002 | McQuarrie et al. |
| 6,436,229 B2 | * | 8/2002 | Tai et al. ............. 257/E21.218 |
| 6,558,559 B1 | * | 5/2003 | Becker et al. ................. 216/2 |
| 6,740,247 B1 | | 5/2004 | Han et al. |

OTHER PUBLICATIONS

Wolf et al., Silicon Processing for the VLSI Era, 1986, Lattice Press, vol. 1, pp 386, 332–33, 399, 514, 520, 565–67.*
Wolf, Silicon Processing for the VLSI Era, 2002, Lattice Press, vol. 4, pp. 66–67.*
Rossnagel et al., Handbook of Plasma Processing, 1990, Noyes Publications, pp. 200–201.*
Ashurst et al., Journal of Microelectromechanical Systems, Mar. 2001, vol. 10, No. 1, pp. 41–49.*

* cited by examiner

*Primary Examiner*—Nadine G. Norton
*Assistant Examiner*—Eric B. Chen
(74) *Attorney, Agent, or Firm*—Gregory R. Muir

(57) ABSTRACT

The present invention teaches a method and apparatus for removing sacrificial materials in fabrications of microstructures using one or more selected spontaneous vapor phase etchants. The selected etchant is fed into an etch chamber containing the microstructure during each feeding cycle of a sequence of feeding cycles until the sacrificial material of the microstructure is exhausted through the chemical reaction between the etchant and the sacrificial material. Specifically, during a first feeding cycle, a first amount of selected spontaneous vapor phase etchant is fed into the etch chamber. At a second feeding cycle, a second amount of the etchant is fed into the etch chamber. The first amount and the second amount of the selected etchant may or may not be the same. The time duration of the feeding cycles are individually adjustable.

100 Claims, 3 Drawing Sheets

ETCHING METHOD IN FABRICATIONS OF MICROSTRUCTURES

TECHNICAL FIELD OF THE INVENTION

The present invention is related generally to the art of fabrications of microstructures which includes such devices as microelectromechanical systems, semiconductor devices, and, more particularly, to methods and apparatus of non-plasma spontaneous vapor phase etching processes used in the fabrications of the microstructures.

BACKGROUND OF THE INVENTION

Sacrificial layers of selected sacrificial materials are commonly used in fabrications of microstructures, such as microelectromechanical systems and semiconductor devices. A typical and pervasively used sacrificial material is amorphous silicon. Once the desired structures of the microstructure are formed, the sacrificial layers are removed by etching. The success of the etching process depends upon the selectivity of the etching process. Performance, uniformity and yield can all be improved with increases in the etch selectivity of the sacrificial layers.

More recently, the etching method using selected gas phase etchants has drawn great interest in fabricating microstructures due to its many advantages, such as high selectivity, less contamination and less process stiction as opposed to other possible etching methods, such as a wet etching techniques. In terms of the different ways of feeding the selected gas etchant into the etch chamber containing the microstructure to be etched, the current gas etching method has two major categories—continuous etchant feeding and one-time (Batch) etchant feeding. In a typical continuous etchant feeding process, the gas etchant continuously flows through the etch chamber until the sacrificial materials of the microstructure are exhausted by the chemical reaction inside the etch chamber. This etch process is unfavorable because the continuous flowing of the gas etchant etches the sacrificial layers too fast which makes the etching process difficult to control. Moreover, the continuous flow is inefficient in usage of etchant. In a typical one time etchant feeding process, the selected gas etchant is introduced into the etch chamber at one time and a chemical reaction occurs between the gas etchant and the sacrificial materials inside the etch chamber. This etch feeding technique improves the etchant usage efficiency and the possibility of precise control of the etching process. However, it also has disadvantages. For example, because the gas etchant and the sacrificial materials and the chemical reaction therebetween are confined in the etch chamber through out the etching process, the etching product (reaction product) will accumulate within the etch chamber. The accumulation may result the deposition of the etching products on the surface of the microstructure. At an extreme situation, the chemical reaction may be reversed, yielding re-deposition of the sacrificial material. In addition, because the amount of the etchant fed into the etching system at one time is fixed and the maximum amount of the sacrificial material that can be removed by the fixed amount of the etchant is limited for a given etching system, the maximum amount of the etchant fed into the etching at one time may not be enough to remove a larger amount of the sacrificial material. In an approach to solve this problem, additional amounts of the etchant are fed into the etching system in a discontinuous fashion. For example, in feeding an additional amount of the etchant, the etching system is pumped out and then provided with the additional amount of the etchant. During the pumping out process, the chemical reaction between the etchant and the sacrificial material, thus the etching process is stopped until the additional amount of the etchant is provided. This feeding process, however, may cause "etch front marks" and/or etching un-uniformities in the microstructures after etch. For example, when the first amount of the etchant fed at one time into the etching system is not enough to remove all sacrificial materials in the microstructure, the boundaries of the sacrificial material (the etch front) may create "marks" in the structures of the microstructure when the chemical reaction (etching process) is stopped due to the lack of the etchant. These "marks" may be permanent through out and even after the etching process.

Accordingly, a method and apparatus is desired for efficiently removing sacrificial layers in microstructures using selected gas phase etchant.

SUMMARY OF THE INVENTION

In view of the forgoing, the present invention teaches a method for removing the sacrificial materials in fabrications of microstructures using one or more selected spontaneous vapor phase etchants. A spontaneous etchant is a chemical etchant such that a chemical reaction between said etchant and a sacrificial material occurs spontaneously and does not require activation energy. And a spontaneous vapor phase etchant is a spontaneous chemical etchant that reacts with the sacrificial material in vapor phase. In the embodiments of the invention, the supply of the etchant to remove the sacrificial materials can be "infinite"—e.g. much larger than the quantity required to completely remove the sacrificial materials. The etchant is fed into the etch chamber containing the microstructure during each feeding cycle of a sequence of feeding cycles until the sacrificial material of the microstructure is exhausted through the chemical reaction between the etchant and the sacrificial material. Specifically, during a first feeding cycle, a first discrete amount of selected spontaneous vapor phase etchant is fed into the etch chamber. At a second feeding cycle, a second discrete amount of the etchant is fed into the etch chamber. The first discrete amount and the second discrete amount of the selected etchant may or may not be the same. This etchant feeding process continues until the sacrificial material of the microstructure is exhausted through the chemical reaction between the etchant and the sacrificial materials. The time duration of the feeding cycles are individually adjustable.

At each feed cycle, the etchant is fed into the etch chamber via an outer circulation loop that passes through the etch chamber and an exchange chamber in which the etchant is prepared. After the feeding, the etchant is circulated via an inner circulation loop that passes through the etch chamber but not the exchange chamber for etching the sacrificial material. The etchant circulation via the inner circulation loop is stopped and switched into the outer circulation loop upon the arrival of the following etchant feeding during the following feeding cycle. The time interval between any two consecutive etchant feedings is also adjustable.

In order to expedite the chemical reaction between the selected etchant and the sacrificial material inside the etch chamber, the selected spontaneous vapor phase etchant preferably has a pressure from 0.1 to 15 torr. The etchant is mixed with one or more diluent gases with a partial pressure preferably from 20 to 700 torr. Such a gas mixture is particularly useful for removing the sacrificial materials underneath the functional layers of the microstructure.

In an embodiment of the invention, a method is disclosed. The method comprises: loading a microstructure into an etch chamber, wherein the microstructure comprises a sacrificial material and one or more structural materials; providing a first discrete amount of spontaneous vapor phase etchant recipe during a first feeding cycle of a sequence of feeding cycles for removing the sacrificial material; and providing a second discrete amount of the etchant recipe after the first feeding cycle and during a second feeding cycle that follows the first feeding cycle of the sequence of feeding cycles for removing the sacrificial materials.

In another embodiment of the invention, a method for etching a sample in an etch chamber is disclosed. The method comprises: (a) establishing a first pressure inside a first chamber, wherein the first pressure is equal to or lower than a pressure in a second chamber that contains a spontaneous vapor phase etchant; (b) filling the first chamber with the etchant; (c) filling the first chamber with a diluent gas such that the pressure inside the first chamber reaches a second pressure that is higher than the first pressure; and (d) circulating the etchant and the diluent gas through the etch chamber.

In another embodiment of the invention, a method for etching a sample in an etch chamber is disclosed. The method comprises: circulating a first amount of spontaneous vapor phase etchant via a first loop that passes through the etch chamber for etching the sample; and circulating a second amount of the etchant via a second loop that passes through the etch chamber and a first chamber other than the etch chamber, wherein the first chamber is not part of the first loop.

In yet another embodiment of the invention, an etching system for etching a sample is provided. The system comprises: an first chamber containing the sample; a first circulation loop through which a first amount of spontaneous vapor phase etchant is circulated, wherein the first circulation loop passes through the first chamber; and a second circulation loop through which a second amount of the etchant is circulated, wherein the second circulation loop passes through the first chamber and a second chamber that is not a part of the first circulation loop.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention teaches a method for removing sacrificial materials in fabrications of microstructures using one or more selected spontaneous vapor phase etchants. The etchant is fed into the etch chamber during a feeding cycle of a sequence of feeding cycles until the sacrificial material of the microstructure is consumed by the chemical reaction between the etchant and the sacrificial material.

Figure 1:
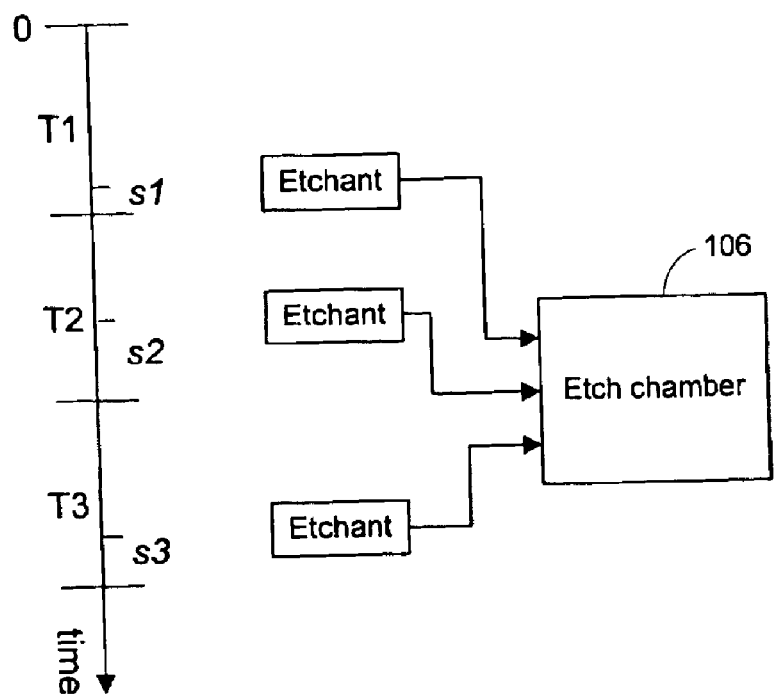
FIG. 1 schematically illustrates a method of feeding spontaneous vapor phase etchant into an etch chamber containing a microstructure according to the invention.

Referring to FIG. 1, three consecutive feeding cycles $T_1$, $T_2$, and $T_3$ of a sequence of feeding cycles are illustrated along a timeline. Though preferably the same, the time intervals of these feeding cycles (e.g. $T_1$, $T_2$ and $T_3$) are not necessarily the same. During a time slot within each feeding cycle, an amount of selected spontaneous vapor phase etchant recipe is fed into etch chamber 106 that contains the microstructure to be etched. The selected etchant recipe may be only a selected spontaneous vapor phase etchant, such as noble gas halide (e.g. $XeF_2$) or interhalogen (e.g. bromine trifluoride). Alternatively, the selected etchant recipe may be a mixture of the selected etchant and a diluent gas, such as an inert gas (e.g. $N_2$, He, Ar, Kr and Xe). Moreover, a combination of the etchants (e.g. $XeF_2$ and $BrF_3$) could be used with or without a diluent gas. For example, during time slot $s_1$ of feeding cycle $T_1$, a first amount of the selected etchant recipe is fed into the etch chamber. The etchant recipe then chemically reacts with the sacrificial material— resulting reaction products, also in gas phase. The chemical reaction consumes the selected etchant of the etchant recipe and decreases the amount of the etchant inside the etch chamber. This decrease slows down and may even stop the chemical reaction within the etch chamber before all sacrificial materials are removed. Therefore, a second amount of the selected etchant is fed into the etch chamber during time slot $s_2$ of feeding cycle $T_2$. For the same reason, a third amount of the selected etchant is fed into the etch chamber during time slot $s_3$ of feeding cycle $T_3$, if the sacrificial material within the etch chamber is not totally removed. The feed process continues until all sacrificial materials are removed or in practice, the amount of the sacrificial material inside the etch chamber is below a predefined value. The durations of the time slots in the feeding cycles are not necessary the same. Instead, the time slots are individually adjustable. As a result, time intervals between two consecutive etchant feeding time-slots may not be the same. For example, the time interval between $s_1$ and $s_2$ may not be the same as the time interval between $s_2$ and $s_3$. This benefits the control of the etching rate (e.g. defined as the amount of sacrificial materials removed through the chemical reaction per second) through out the etching process. In an embodiment of the invention in which $XeF_2$ is used as the etchant for removing amorphous silicon in micromirror devices, which will be discussed in detail afterwards, the etching rate is preferably from 10 to 50 angstroms per second, more preferably from 20 to 30 angstroms per second, and more preferably around 20 angstroms per second.

During each etchant feeding cycle, the etchant is fed into the etch chamber via an outer circulation loop that passes through the etch chamber and an exchange chamber in which the etchant is prepared. The outer loop is also used to vent the gases in circulation outside the etch chamber. After the feeding, the etchant is circulated via an inner circulation loop that passes through the etch chamber without passing through the exchange chamber until the next etchant feeding during the following time interval, which will be discussed in the following with reference to FIG. 2.

Figure 2:
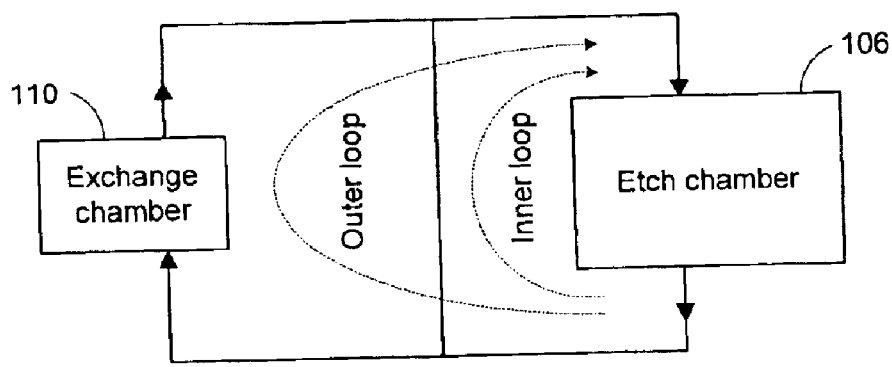
FIG. 2 schematically illustrates two separate circulation loops through which the selected spontaneous vapor phase etchant is circulated.

Referring to FIG. 2, the outer circulation loop illustrated as a dotted line passes through etch chamber 106 and exchange chamber 110. The exchange chamber provides the selected spontaneous vapor phase etchant recipe with desired properties, such as concentration and pressure. When the selected etchant is prepared, the outer loop is opened and the prepared etchant is fed into the etch chamber via the outer loop during a time slot (e.g. time slot $s_1$) of a feeding cycle (e.g. feeding cycle $T_1$). In addition to feeding the prepared etchant into the etch chamber, the outer loop is also used for venting the chemical reaction products out of the etch chamber. Specifically, a pump is connected to the outer loop and pumps the reaction products from the outer loop outside the etching system. In an embodiment of the invention, the pump is connected to the exchange chamber and pumps the reaction products from the outer loop outside the etching system. Of course, during one feeding cycle (e.g. feeding cycle $T_1$, $T_2$ or $T_3$) this venting process is preferably conducted at the beginning of the feeding cycle or at least before the processes of preparing the selected etchant and feeding the prepared etchant recipe into the etch chamber.

After the prepared etchant recipe is fed into the etch chamber, the outer loop is closed and the circulation of the etchant is switched from the outer loop to the inner loop that passes through the etch chamber but not the exchange chamber. This switch from the outer loop to the inner loop is accomplished by a plurality of valves connected to the inner and outer loop. As the etchant flows through the etch chamber, it chemically reacts with the sacrificial material of the microstructure inside the etch chamber and generates one or more reaction products also in gas phase. Because the etchant is flowing through the etch chamber, the chemical reaction rate is faster than that when the etchant is not flowing. After rounds of circulations via the inner loop, the amount of the etchant is decreased and the amount of the reaction products is increased due to the chemical reaction between the etchant and the sacrificial material within the etch chamber. The inner loop is then stopped and the outer loop is opened for feeding additional etchant and venting the reaction products. The circulation via the inner loop and the outer loop alternates and continues until the sacrificial material of the microstructure inside the etch chamber is either totally removed or below a predefined amount value. Though it is preferred that one inner loop and one outer loop are provided for the etching system, this is not an absolute requirement. Instead, a plurality of outer loops may be provided. For example, each outer loop may be connected to a separate exchange chamber, and all outer loops are connected to the etch chamber.

The sacrificial material is removed through a chemical reaction between the sacrificial material and the selected etchant. Because the speed of the chemical reaction depends partially upon the etchant partial pressure, the partial pressure of the etchant inside the etch chamber is preferably from 0.1 to 15 torr in an embodiment of the invention in which vapor phase $XeF_2$ is employed to remove amorphous silicon in micromirror devices, which will be discussed in detail afterwards. With the selected partial pressure, the etchant chemically reacts with the sacrificial materials that are directly exposed to the etchant at the desired reaction speed. However, it is often difficult for the etchant alone to remove the sacrificial materials that are not directly exposed to the etchant, such as the sacrificial materials underneath the functional layers of the microstructure. For this reason, the selected etchant with the selected partial pressure is mixed with a selected diluent gas having a selected partial pressure that is preferably higher than the partial pressure of the selected etchant. For example, the selected pressure for the diluent gas is preferably from 20 to 700 torr when vapor phase $XeF_2$ is employed to remove amorphous silicon in micromirror devices.

The mixing of the selected vapor phase etchant and a diluent gas with different pressures can be performed in a variety of ways. As an example in which the diluent gas has a higher partial pressure than the etchant, the exchange chamber is first pumped out by the connected pump so as to obtain a pressure inside the etch chamber lower or equal to the partial pressure of the selected etchant. The etchant is then filled into the exchange chamber. The diluent gas at higher pressure is then filled into the exchange chamber and mixed with the etchant gas.

In the following, the present invention will be discussed with references to embodiments in which spontaneous vapor phase $XeF_2$ is used as the selected etchant for etching amorphous silicon of a micromirror device. It will be appreciated by those skilled in the art that the following discussion is for demonstration purposes only, and it should not be interpreted in any ways as a limitation to the present invention. Instead, other suitable variations to the following embodiments without departing from the spirit of the present invention may also be employed. For example, the selected etchant can be other spontaneous vapor phase noble gas halide in addition to $XeF_2$ or spontaneous vapor phase interhalogen, such as bromine trichloride, or other proper chemical species, such as HF for removing amorphous (or porous) silicon as the sacrificial material. The microstructure having sacrificial materials can be semiconductor devices or other types of microstructures.

Figure 3:
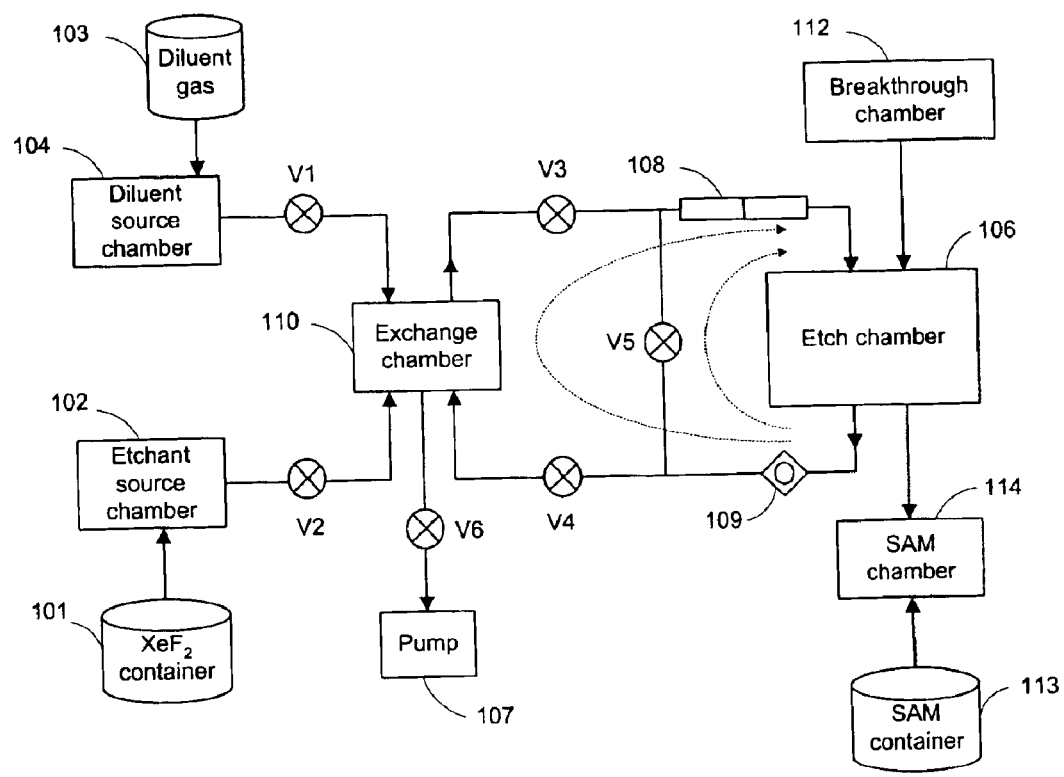
FIG. 3 is a block diagram illustrating an etching system of the present invention.

Referring to FIG. 3, the etching system comprises etch chamber 106 and exchange chamber 110. The etch chamber contains the micromirror device having amorphous (or porous) silicon to be removed. The spontaneous vapor phase $XeF_2$ and one or more diluent gases are mixed in the exchange chamber. In the embodiment of the invention, the diluent gas is preferably an inert gas, such as nitrogen, helium, argon, krypton or xenon, or a mixture of one or more inert gases, and more preferably gas nitrogen or gas helium. The cubic volume of the exchange chamber is preferably much less than (e.g. around one twentieth of, or one fiftieth of) the cubic volume of the etch chamber such that the volumetric amount of the mixed gas of $XeF_2$ and the diluent gas is much smaller than the mixed gas (including $XeF_2$, diluent gas and the etching products) in the etch chamber. As a result, the feeding of the mixed gas into the etch chamber during one feeding cycle is a small perturbation to and does not dramatically change the chemical reaction in process.

The exchange chamber, the etch chamber and valve V3, circulation pump 108, valve V4 and endpoint detector 109 form the outer circulation loop illustrated as a dotted line. The etch chamber, circulation pump 108, valve V5 and endpoint detector form the inner circulation loop as illustrated in another dotted line. The arrows in the figure represent the flow direction of the mixed gases within the etching system. Of course, the flow directions can be reversed, as long as all flow directions within each segment of the flow path are reversed. The circulation pump 108 continuously pumps the gases passing by so as to maintain the circulation via the two loops. The endpoint detector dynamically measures the concentration of a reaction product, such as $SiF_4$ gas flowing out of the etch chamber and analyzes the measured concentration to obtain the progress information on the etching process inside the etching chamber. In the embodiment of the invention, the endpoint detector is a Process Sense from MKS (MKS, Inc.) that uses Infra-Red light to dynamically measure the concentration of $SiF_4$. Other detectors, such as a Residual Gas Analyzer from AMETEK (AMETEK Inc.) may also be employed. Valves V3, V4 and V5 switch the gas flow between inner circulation loop and the outer circulation loop. Specifically, the outer circulation is activated by opening (e.g. allowing the gas to flow through) valves V3 and V4, and closing (e.g. blocking the gas to flow through) valve V5. The inner circulation loop is activated by opening valve V5 and closing valves V3 and V4.

The exchange chamber is further connected to diluent source chamber 104 via valve V1, and the diluent source chamber is connected to diluent gas cylinder 103. In the embodiment of the invention, helium is preferably used as the diluent gas and contained in the diluent gas cylinder. In addition to the diluent source chamber, the exchange chamber is also connected to etchant source chamber 102 via valve V2 and pump 107 via valve V6. The etchant source chamber is further connected to the etchant gas container, such as $XeF_2$ container 101.

In the etching process, $XeF_2$ gas is fed into the etch chamber and chemically reacts with the amorphous silicon. The chemical reaction is expressed as:

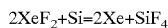

$$2XeF_2 + Si = 2Xe + SiF_4$$

In order to expedite the chemical reaction and enhance the efficiency of the chemical reaction especially between $XeF_2$ and Si underneath the functional layers of the micromirror devices, such as the mirror plates of the micromirror devices, the partial pressure of the $XeF_2$ gas is at a value preferably from 0.1 to 15 torr. The $XeF_2$ gas is mixed with a diluent gas, such as helium, having a partial pressure preferably from 20 to 700 torr. This mixed gas is then circulated through the etch chamber via the inner circulation loop and the outer circulation loop. In the embodiment of the invention, the temperature of the etch chamber is preferably maintained at around 25° C. degrees. Because the chemical reaction releases heat, which is localized in a narrow region in the vicinity of the sacrificial layers, this region may have a higher temperature than the gases inside the etch chamber.

The spontaneous vapor phase $XeF_2$ is contained in $XeF_2$ container 101 that contains both solid phase $XeF_2$ and vapor phase $XeF_2$. The temperature of the $XeF_2$ container is preferably around 25° degrees and the pressure is preferably from 0.1 to 15 torr, and more preferably around 4 torr. The $XeF_2$ container is connected to etchant source chamber 102 that contains vapor phase $XeF_2$ only. The pressure of the etchant source chamber is preferably around 4 torr and the temperature is around 25° degrees. In an alternative embodiment of the invention, $XeF_2$ container 101 is not provided and the solid phase $XeF_2$ is directly disposed inside etchant source chamber 102. At room temperature and 4 torr, a portion of the solid-state $XeF_2$ sublimates into vapor phase $XeF_2$ inside the etchant source chamber.

In the following, an exemplary etching process will be discussed with reference to FIG. 4, which illustrates steps executed in the exemplary etching process. For simplicity and demonstration purposes without losing the generality, the following discussion assumes that helium gas is used as the vapor phase diluent.

Figure 4:
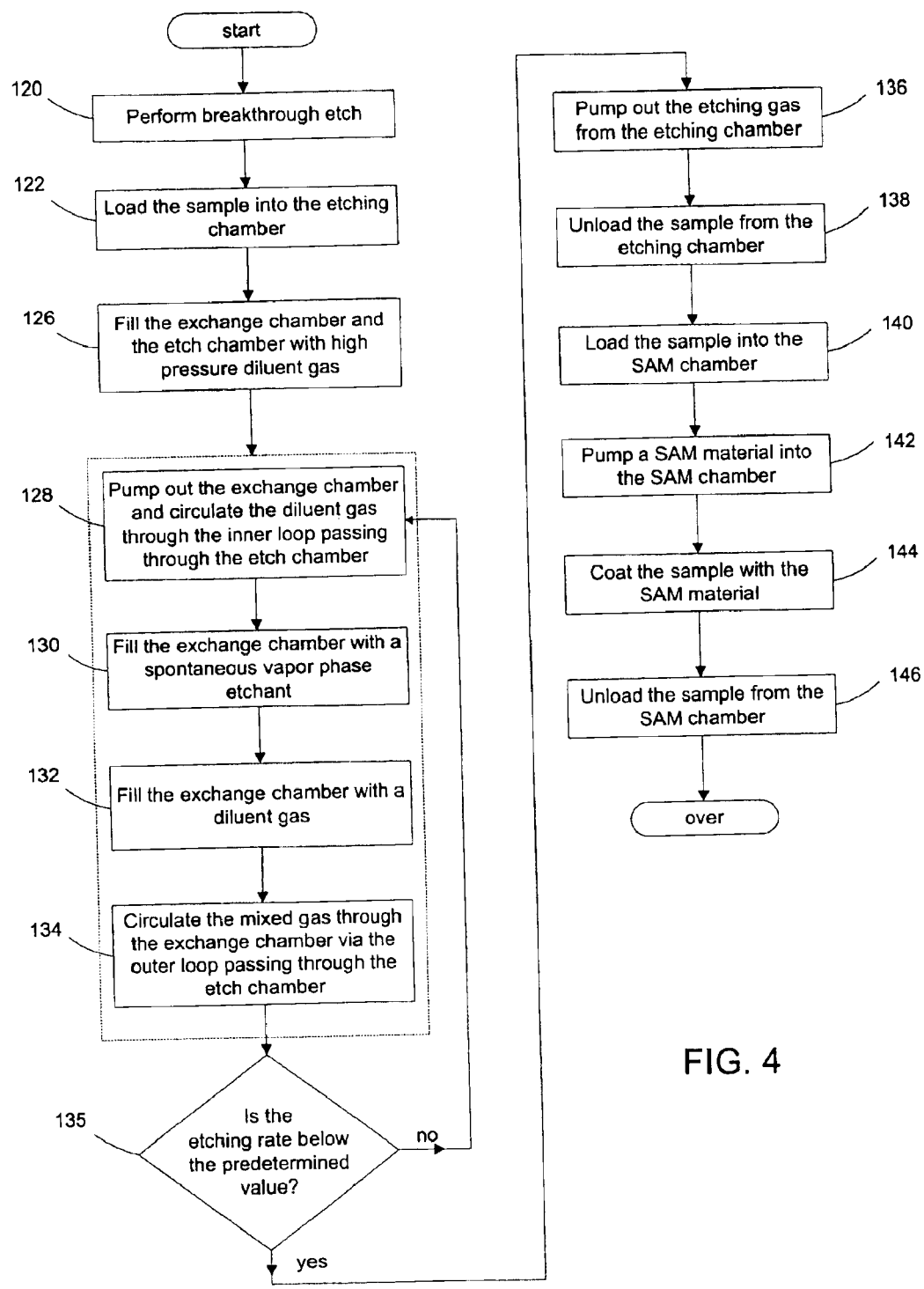
FIG. 4 is flow chart illustrating steps executed for etching samples using the etching system in FIG. 3.

Referring to FIG. 4, the etching process begins with filling the exchange chamber and the etch chamber with the helium gas (step 126) that has a pressure preferably from 20 to 700 torr (steps 120 and 122 are optional and will be discussed afterwards). This filling step is achieved by opening the valves V1, V3, V4, V5 and closing the valves V2 and V6 for a time period, preferably around 500 milliseconds until the diluent gas inside the etching system reaches equilibrium. Then a sequence of etchant feeding processes is conducted during a sequence of feeding cycles as discussed with reference to FIG. 1 and FIG. 2. Each feeding process comprises the steps of 128 through 135 in the flow chart and is executed during each feeding cycle (e.g. feeding cycle $T_1$, $T_2$ or $T_3$ in FIG. 1) until the sacrificial material inside the etch chamber is either exhausted or below a predefined amount, such as less then 1% of the initial amount. For example, during the first feeding cycle $T_1$ in FIG. 1, the etchant feeding process starts at pumping out the exchange chamber so as to reduce the pressure inside exchange chamber and meanwhile, circulating the diluent gas through the inner loop (step 128) for a time period preferably from 100 to 1500 milliseconds. This step is accomplished by opening valve V5 and valve V6 and closing valves V1, V2, V3 and V4. As a result, the pressure inside the exchange chamber is reduced to a pressure from 0.1 to 15 ton. The pressure inside etch chamber 106 is maintained at a pressure preferably from 20 to 700 torr. Because the pressure of the exchange chamber is equal to or below the pressure of $XeF_2$ inside etchant source chamber 102, $XeF_2$ can thus flow into the exchange chamber, which is conducted at step 130 by opening valve V2 and closing valves V1, V3, V4 and V6. At this step, valve V5 is left open—allowing the diluent gas to keep on circulating via the inner circulation loop. During this step, a first amount of $XeF_2$ flows into the exchange chamber. The amount can be controlled by the duration of opening valve V2. Alternatively the amount can be controlled through controlling the pressure of the exchange chamber via valve V6 and the pump connected to the exchange chamber. For example, by controlling the pumping time of the exchange chamber through controlling the open duration of valve V6, the pressure inside the exchange chamber (e.g. the total pressure of the gas mixture, which may comprises $XeF_2$, He, Xe and $SiF_4$) can be set to a pressure value, such as 1 torr, 2 torr and 3 torr, corresponding to the desired additional amount of $XeF_2$. For example, when the pressure inside the exchange chamber is set to 1 torr, an additional amount of $XeF_2$ corresponding to 3 torr (3 torr=4 torr−1 torr) is fed into the exchange chamber when valve V2 is opened. In the embodiment of the invention, the duration of opening valve V2 is preferably around 500 milliseconds. During the 500 milliseconds, around $6 \times 10^{-5}$ mole $XeF_2$ gas flows into the exchange chamber from etchant source chamber 102. Then an amount, preferably around $1.6 \times 10^{-3}$ mole of helium diluent gas is fed into the exchange chamber at step 132. The helium diluent gas mixes with the $XeF_2$ etchant gas and reaches equilibrium. This step is accomplished by opening valve V1 and closing valves V2, V3, V4 and V6 for a time duration preferably around 100 milliseconds. After the $XeF_2$ gas is mixed with the helium gas, the mixed gas is then fed into etch chamber 106 at step 134. This feeding step is accomplished by opening valve V3 and valve V4 and closing the rest of the valves, including valves V1, V2, V5, and V6. It can be seen that, by closing valve V5 and opening valves V3 and V4, the inner circulation loop is closed and the outer circulation loop is opened. As a result, the mixed gas flows via the outer circulation loop and passes through the etch chamber for etching the amorphous silicon through the chemical reaction inside the etch chamber. This step may last for a time period, preferably from 1000 to 3000 milliseconds, depending upon the measurement result of the endpoint detector 109. The endpoint detector, which is preferably an MKS Process Sense dynamically measures the amount of reaction product $SiF_4$ flowing out the etch chamber using Infra-Red light. Other endpoint detectors, such as an RGA endpoint detector may also be used. Based on the measured value of the amount of $SiF_4$, an etching rate is calculated and then compared to a predetermined value (step 135). The etching rate is proportional to the derivative of the measured amount of $SiF_4$. If the etching rate is higher then the predetermined amount value, indicating that the sacrificial material of amorphous silicon has not been totally removed, the etching process loops back to step 128. Otherwise, the etching process continues at step 136. Step 135 terminates the first etchant feeding cycle $T_1$.

During this feeding cycle, the etchant recipe is fed into the etch chamber via the outer loop, which is switched from the inner loop. When the $XeF_2$ is circulated through the etch chamber, a portion of the $XeF_2$ gas is consumed by the chemical reaction, resulting in the reduction of the amount of $XeF_2$ in circulation. For this reason, an additional amount of $XeF_2$ gas is fed into the etch chamber during the second etchant feeding cycle $T_2$, which is initiated by the etching process looping back to step 128.

At step 128 during the second etchant feeding cycle, the exchange chamber is pumped out to reduce the pressure and exhaust the etching products and Xe gas and $SiF_4$ gas. Different from step 128 executed in the first etchant feeding cycle $T_1$, an amount of $XeF_2$ recipe is still circulating through the etch chamber via the inner circulation loop. This is accomplished by opening the valves V5 and V6 and closing the rest of the valves. After step 128, a second amount of spontaneous vapor phase $XeF_2$ is filled into the exchange chamber (step 130) followed by filling an amount of diluent helium gas into the exchange chamber (step 132) so as to mix the $XeF_2$ gas with the helium gas. The mixed gas is then fed into the etch chamber by stopping the inner circulation loop and opening the outer circulation loop (step 134).

Each of these steps (steps 128 through 134) during the second feeding cycle $T_2$ is executed for a certain time period. For example, step 128 is executed for a time period preferably from 100 to 1500 milliseconds. The time period for executing step 130 is preferably around 500 milliseconds, and the time period for step 132 is preferably around 100 milliseconds. The etchant circulation step of 134 is preferably from 1000 to 3000 milliseconds. Of course, the time period of each step may be adjusted. For example, the time period for step 130, in which the exchange chamber is filled with $XeF_2$, may be reduced when less amount of $XeF_2$ is expected to be fed into the etch chamber. This may happen especially when less than the expected amount of $XeF_2$ is consumed in the etch chamber during the previous etchant feeding cycle and close to the end of the etching process when the amount of the sacrificial material inside the etch chamber is small. The time period of step 134, in which the mixed gas is circulated via the outer loop through the etch chamber is also adjustable. In particular, the time period can be increased when, for example, the $XeF_2$ gas consuming rate (defined as the amount of $XeF_2$ in molar mass consumed per millisecond) is lower than expected (e.g. the initial consuming rate). And the time period can be reduced when the $XeF_2$ consuming rate is higher than the expected. As a general situation according to the embodiment, the time duration of each etchant feeding cycle, thus the total time period of executing steps 128 through 135, is preferably from 7.5 to 15 seconds.

As the mixed gas of $XeF_2$ and helium circulate via the outer loop, the endpoint detector measures the amount of $SiF_4$ flowing out the etch chamber and the derivative of the measured amount over time. If a decrease (the derivative) of the measured amount is larger than the predetermined value, indicating that the sacrificial material inside the etch chamber has not been totally removed, the etching process loops back to step 128 and starts the third etchant feeding cycle $T_3$ (as shown in FIG. 1). Otherwise, the etching process continues at step 136.

When the amount of the sacrificial material inside the etch chamber is below the predetermined value, the etching process can be terminated and the microstructure can be unloaded from the etch chamber.

After the removal of the sacrificial materials such as amorphous silicon, materials of the functional layers of the microstructure are left. Exemplary such materials of the functional layers comprises: metal elements (e.g. Al, Ir, Ti, Ag, W, Ta and Mo), metal alloys (e.g. $WTi_x$, $WMo_x$, and $WTa_x$), metal compounds (e.g. $WAl_x$, $AlTi_x$) including metal silicides (e.g. $AlSi_x$, $WSi_x$, $MoSi_x$, $TiSi_x$, $ZrSi_x$, $CrSi_x$, $TaSi_x$, $AlSi_xCu_y$, and $TiW_xSi_y$), ceramic materials (e.g. silicon nitride, silicon carbide, polysilicon, titanium nitride, titanium oxide(s), titanium carbide, $CoSi_xN_y$, $TiSi_xN_y$, $TaSi_xN_y$, or other ternary and higher compounds), and other functional films, such as anti-reflection films often deposited on a surface of a glass substrate of the micromirror device.

After the etching process, other processes, such as coating the microstructure with self-assembly-monolayer (SAM) material, can be performed at steps 136 through 146.

At step 136, the etch chamber is pumped out to remove the gases from inside the etch chamber. The microstructure is unloaded from the etch chamber (step 138) and transferred into the SAM chamber (SAM chamber 114 in FIG. 3) at step 140. The SAM chamber is then filled with the SAM material (step 142) so as to coat the microstructure with the SAM material at step 144. After coating, the microstructure is unloaded from the SAM chamber at step 146. In transferring the microstructure from one chamber (e.g. the etchant chamber) to another (e.g. the SAM chamber), a load-lock that connects the chambers is preferably employed. During a transfer from one chamber to another, the microstructure is unloaded from the first chamber and loaded into the load-lock before loading the microstructure into the second chamber.

In addition to SAM coating process, breakthrough etch may also be applied to the microstructure. Specifically, the breakthrough etch is performed at breakthrough chamber 112 (in FIG. 3) at step 120 before etching the microstructure using spontaneous vapor phase $XeF_2$. The breakthrough etch is executed for cleaning the non-etchable films of the microstructure. After the completion of the breakthrough etch, the microstructure is unloaded from the breakthrough chamber and transferred into the etch chamber at step 122.

It will be appreciated by those skilled in the art that a new and useful apparatus and method for removing sacrificial materials of microstructures have been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. For example, the sacrificial layers, if silicon, could also be removed by other spontaneous chemical vapor phase etchants, such as other noble gas halides or interhalogens (bromine trifluoride, bromine trichloride, etc.). Therefore, the invention as described herein contemplates all such embodiments as may come within the scope of the following claims and equivalents thereof.

What is claimed is:

1. A method, comprising:
    loading a microstructure into an etch chamber, wherein the microstructure comprises a sacrificial material and one or more structural materials;

providing a first discrete amount of spontaneous vapor phase etchant recipe during a first feeding cycle of a sequence of feeding cycles for removing the sacrificial material;

pumping a portion of a gas out from the etching chamber, wherein the gas comprises a portion of the etchant recipe and a portion of an etching product;

providing a second discrete amount of the etchant recipe after the first feeding cycle and during a second feeding cycle that follows the first feeding cycle of the sequence of feeding cycles for removing the sacrificial materials; and wherein another portion of the first amount of the etchant recipe is circulated in a circulation loop that passes through the etching chamber during the steps of pumping and providing the second discrete amount of the etchant recipe.

2. The method of claim 1, further comprising:
filling the etch system with the first amount of the etchant.

3. The method of claim 1, further comprising:
filling the etch system with the second amount of the etchant.

4. The method of claim 1, wherein the first amount of etchant is fed during a first time slot of the first feeding cycle; and wherein the second amount of etchant is fed during a second time slot of the second feeding cycle.

5. The method of claim 2, wherein the time interval between the first and second time slot does not equal the time interval of the first feeding cycle.

6. The method of claim 1, wherein the time interval of the first feeding cycle does not equal the time interval of the second feeding cycle.

7. The method of claim 1, wherein the recipe comprises a spontaneous vapor phase etchant; and wherein the amount of the etchant in the first amount of the etchant recipe equals the amount of the etchant in the second amount of the etchant recipe.

8. The method of claim 1, wherein the time interval between the provisions of the first amount of the etchant recipe and the second amount of the recipe is predetermined.

9. The method of claim 1, further comprising: providing a third amount of the etchant recipe during a third feeding cycle of the sequence of feeding cycles from removing the sacrificial material; and wherein the time interval between the provisions of the first amount of the etchant and the second amount of the etchant does not equal the time interval between the provisions of the second amount of the etchant and the third amount of the etchant.

10. The method of claim 1, further comprising:
determining whether the amount of the sacrificial material inside the etch chamber is below a predetermined value.

11. The method of claim 10, wherein the predetermined value is 1% of the total amount of the sacrificial materials before etching.

12. The method of claim 10, further comprising:
dynamically detecting a concentration of an etching product; and
comparing the detected concentration with a predetermined value.

13. The method of claim 12, further comprising;
if a change of the detected concentration over a time unit is lower than a predetermined value, stopping the etching process.

14. The method of claim 12, further comprising:
if a change of the detected concentration over time is equal to or lower than the predetermined value, feeding the second amount of etchant into the etch chamber.

15. The method of claim 1, wherein the step of providing the first amount of the etchant further comprises:
(a) establishing a first pressure inside a first chamber, wherein the first pressure is equal to or lower than a pressure in a second chamber that contains a spontaneous vapor phase etchant;
(b) filling the first chamber with the etchant;
(c) filling the first chamber with a diluent gas such that the pressure inside the first chamber reaches a second pressure that is higher than the first pressure; and
(d) circulating the etchant and the diluent gas through the etch chamber.

16. The method of claim 15, further comprising:
establishing the second pressure inside the etch chamber by filling the etch chamber with the diluent gas before executing step (a).

17. The method of claim 16, wherein the step of (a) further comprises:
maintaining the second pressure inside the etch chamber.

18. The method of claim 16, wherein the step of (b) further comprises:
maintaining the second pressure inside the etch chamber.

19. The method of claim 1, wherein the etchant recipe comprises a spontaneous vapor phase noble gas halide.

20. The method of claim 19, wherein the noble gas halide comprises xenon difluoride.

21. The method of claim 1, wherein the etchant recipe comprises a spontaneous vapor phase interhalogen.

22. The method of claim 19, wherein the interhalogen comprises bromine trichloride.

23. The method of claim 1, wherein the etchant recipe comprises is a spontaneous vapor phase HF.

24. The method of claim 1, wherein the etchant recipe comprises a diluent gas that is an inert gas.

25. The method of claim 24, wherein the inert gas is selected from $N_2$, He, Ar, Kr and Xe.

26. The method of claim 15, wherein the second chamber has a temperature equal to or higher than the temperature of the first chamber.

27. The method of claim 26, wherein the temperature of the second chamber is around 25° C. degrees.

28. The method of claim 15, wherein the second chamber has a cubical volume equal to or less than one twentieth of a cubical volume of the etch chamber.

29. The method of claim 15, wherein the steps (a) through (d) are sequentially executed such that a total time of the sequential execution is from 7.5 seconds to 15 seconds.

30. The method of claim 15, wherein the step (a) is executed for a time from 100 to 1500 milliseconds.

31. The method of claim 15, wherein the step (b) is executed for a time around 500 milliseconds.

32. The method of claim 15, wherein the step (c) is executed for a time from 1000 to 3000 milliseconds.

33. The method of claim 15, further comprising:
breakthrough etching the sample before establishing the second pressure inside the etch chamber.

34. The method of claim 15, further comprising:
coating the sample with a SAM material.

35. The method of claim 1, wherein the etchant has a pressure from 0.1 to 15 torr.

36. The method of claim 24, wherein the diluent gas has a pressure from 20 to 700 torr.

37. The method of claim 1, wherein the structural materials remain in the microstructure after the removal of the sacrificial material.

38. The method of claim 37, wherein the structural materials comprises:

a metal element, a metal alloy, a metal compound, a ceramic material or an anti-reflection film.

39. The method of claim 38, wherein the metal element is selected from Al, Ir, Ti, Ag, W, Ta and Mo.

40. The method of claim 38, wherein the metal alloy is selected from $WTi_x$, $WMo_x$, and $WTa_x$.

41. The method of claim 38, wherein the metal compound is selected from $WAl_x$, $AlTi_x$ and metal silicide.

42. The method of claim 41, wherein the metal silicide is selected from $AlSi_x$, $WSi_x$, $MoSi_x$, $TiSi_x$, $ZrSi_x$, $CrSi_x$, $TaSi_x$, $AlSi_xCu_y$ and $TiW_xSi_y$.

43. The method of claim 38, wherein the ceramic material is selected from silicon nitride, silicon carbide, polysilicon, titanium nitride, titanium oxide(s), titanium carbide, $CoSi_xN_y$, $TiSi_xN_y$, and $TaSi_xN_y$.

44. The method of claim 15, wherein the second amount of the etchant recipe is provided when the first amount of the etchant recipe is being circulated through the etch chamber.

45. A method for etching a sample in an etch chamber, the method comprising:
  (a) establishing a first pressure inside a first chamber, wherein the first pressure is equal to or lower than a pressure in a second chamber that contains a spontaneous vapor phase etchant;
  (b) filling the first chamber with the etchant;
  (c) filling the first chamber with a diluent gas such that the pressure inside the first chamber reaches a second pressure that is higher than the first pressure; and
  (d) circulating the etchant and the diluent gas through a circulation loop that passes through the etch chamber.

46. The method of claim 45, further comprising:
  establishing the second pressure inside the etch chamber by filling the etch chamber with the diluent gas before executing step (a).

47. The method of claim 46, wherein the step of (a) further comprises:
  maintaining the second pressure inside the etch chamber.

48. The method of claim 46, wherein the step of (b) further comprises:
  maintaining the second pressure inside the etch chamber.

49. The method of claim 45, further comprising: iterating an execution comprising the steps (a), (b), (c) and (d) a number of times.

50. The method of claim 45, wherein the etchant is a spontaneous vapor phase noble gas halide.

51. The method of claim 50, wherein the noble gas halide comprises xenon difluoride.

52. The method of claim 45, wherein the etchant is a spontaneous vapor phase interhalogen.

53. The method of claim 52, wherein the interhalogen comprises bromine trichloride.

54. The method of claim 45, wherein the etchant is a spontaneous vapor phase HF.

55. The method of claim 45, wherein the diluent gas is an inert gas.

56. The method of claim 55, wherein the inert gas is selected from $N_2$, He, Ar, Kr and Xe.

57. The method of claim 51, wherein the second chamber has a temperature equal to or higher than the temperature of the first chamber.

58. The method of claim 53, wherein the temperature of the second chamber is around 25° C. degrees.

59. The method of claim 45, wherein the second chamber has a cubical volume equal to or less than one twentieth of a cubical volume of the etch chamber.

60. The method of claim 45, wherein the steps (a) through (d) are sequentially executed such that a total time of the sequential execution is from 7.5 seconds to 15 seconds.

61. The method of claim 45, wherein the step (a) is executed for a time from 100 to 1500 milliseconds.

62. The method of claim 45, wherein the step (b) is executed for a time around 500 milliseconds.

63. The method of claim 45, wherein the step (c) is executed for a time from 1000 to 3000 milliseconds.

64. The method of claim 46, further comprising:
  breakthrough etching the sample before establishing the second pressure inside the etch chamber.

65. The method of claim 49, further comprising:
  detecting a status of a chemical species flowing out from the etch chamber;
  performing a first iteration of the execution comprising the steps (a) through (d); and
  performing a second iteration of the execution comprising the steps (a) through (d) after the first iteration depending upon the detected status of the chemical species.

66. The method of claim 65, wherein the status of the chemical species is the mole mass.

67. The method of claim 65, further comprising:
  stopping etching the microstructure when the status of the chemical species reaches a predetermined value.

68. The method of claim 67, wherein the status of the chemical species is an etching rate.

69. The method of claim 67, wherein the predetermined value is 1% or less.

70. The method of claim 67, wherein the chemical species is selected from SiF, $SiF_3$ and $SiF_4$.

71. The method of claim 67, further comprising:
  coating the sample with a SAM material.

72. A method, comprising:
  loading a microstructure into an etch chamber, wherein the microstructure comprises a sacrificial material and one or more structural materials;
  circulating a first amount of spontaneous vapor phase etchant recipe via a first loop that passes through the etch chamber for removing the sacrificial material; and
  circulating a second amount of the etchant recipe via a second loop that passes through the etch chamber and a first chamber other than the etch chamber for removing the sacrificial material, wherein the first chamber is not part of the first loop.

73. The method of claim 72, wherein the step of circulating the first amount of etchant via the first loop is performed for a time period determined by a chemical reaction rate of the etchant with a component of the sample.

74. The method of claim 73, wherein the time period is from 500 to 3500 milliseconds.

75. The method of claim 74, wherein the time period is from 1000 to 3000 milliseconds.

76. The method of claim 73, further comprising:
  detecting a status of a chemical species; and
  stopping the etching process when the status of the chemical species reaches a predetermined value.

77. The method of claim 73, wherein the chemical species is selected from SiF, $SiF_3$ and $SiF_4$; and wherein the status is molar mass.

78. The method of claim 72, wherein the step of circulating the second amount of etchant recipe via the second loop is performed when the first amount of the etchant recipe reaches a critical value.

79. The method of claim 78, wherein the critical value of the etchant is dynamically determined based on a chemical reaction between the etchant and a component of the sample.

80. The method of claim 72, wherein the etchant recipe comprises a spontaneous vapor phase noble gas halide.

81. The method of claim 80, wherein the noble gas halide is xenon difluoride.

82. The method of claim 72, wherein the etchant recipe comprises a spontaneous vapor phase interhalogen.

83. The method of claim 82, wherein the interhalogen comprises bromine trichloride.

84. The method of claim 72, wherein the etchant recipe comprises a spontaneous vapor phase HF.

85. The method of claim 72, wherein the etchant recipe comprises a diluent gas.

86. The method of claim 85, wherein the diluent gas is an inert gas.

87. The method of claim 86, wherein the inert gas is selected from $N_2$, He, Ar, Kr and Xe.

88. The method of claim 72, wherein the etchant recipe comprises a spontaneous vapor phase etchant; and wherein the amount of the etchant in the first amount of the etchant recipe equals the amount of the etchant in the second amount of the etchant recipe.

89. The method of claim 72, wherein the etchant recipe comprises a spontaneous vapor phase etchant; and wherein the amount of the etchant in the first amount of the etchant recipe does not equal the amount of the etchant in the second amount of the etchant recipe.

90. The method of claim 81, wherein the structural materials remain in the microstructure after the removal of the sacrificial material.

91. The method of claim 90, wherein the structural material comprises a metal element, a metal alloy, a metal compound, a ceramic material or an anti-reflection material.

92. A method, comprising:
    loading a microstructure into an etching chamber, wherein the microstructure comprises a sacrificial material and a structural material;
    providing a first discrete amount of spontaneous vapor phase etchant recipe comprising vapor phase xenon difluoride into the etching chamber during a first feeding cycle of a sequence of feeding cycles for removing the sacrificial material;
    pumping a first portion of the etchant recipe and a portion of an etching product out from the etching chamber, while a second portion of the etchant recipe passes through the etching chamber;
    providing a second discrete amount of the etchant recipe into the etching chamber after the first feeding cycle and during a second feeding cycle of the sequence of feeding cycles for removing the sacrificial material; and
    wherein the second portion of the etchant recipe is circulated in a circulation loop passing through the etching chamber during the interval between the steps of providing the first and second amount of etchant recipe.

93. The method of claim 92, wherein the etchant recipe further comprises a diluent gas.

94. The method of claim 93, wherein the diluent gas is an inert gas.

95. The method of claim 94, wherein the inert gas is helium gas.

96. The method of claim 95, wherein the inert gas is nitrogen gas.

97. The method of claim 92, wherein the first amount equals the second amount of the etchant recipe.

98. The method of claim 92, wherein the interval between the steps of providing the first and second amount of the etchant recipe is predetermined.

99. The method of claim 92, further comprising: dynamically detecting the concentration of the etchant recipe inside the etching chamber.

100. The method of claim 99, further comprising:
    dynamically detecting the concentration of a chemical product pumped out from the etching chamber; and
    determining the concentration of the etchant recipe inside the etching chamber from the detected concentration of the chemical product.

* * * * *